United States Patent [19]

Erhart et al.

[11] Patent Number: 5,063,533
[45] Date of Patent: Nov. 5, 1991

[54] RECONFIGURABLE DEINTERLEAVER/INTERLEAVER FOR BLOCK ORIENTED DATA

[75] Inventors: Richard A. Erhart, Boynton Beach; Barry W. Herold; Joan S. DeLuca, both of Boca Raton, all of Fla.

[73] Assignee: Motorola, Inc., Schaumburg, Ill.

[21] Appl. No.: 335,394

[22] Filed: Apr. 10, 1989

[51] Int. Cl.$^5$ ............................................. G06F 12/00
[52] U.S. Cl. ..................... 395/425; 364/DIG. 2; 364/957.1; 364/966.3; 364/959.1
[58] Field of Search ... 364/200 MS File, 900 MS File; 365/174; 371/10.1

[56] References Cited

U.S. PATENT DOCUMENTS

| | | |
|---|---|---|
| 3,979,582 | 9/1976 | Mims . |
| 4,034,370 | 7/1977 | Mims . |
| 4,080,599 | 3/1978 | Conti . |
| 4,166,289 | 8/1979 | Murtha et al. . |
| 4,217,660 | 8/1980 | En . |
| 4,254,477 | 3/1981 | Hsia et al. ............... 371/10.1 X |
| 4,291,308 | 9/1981 | Provine . |
| 4,398,248 | 8/1983 | Hsia et al. ............... 364/200 |
| 4,417,248 | 11/1983 | Mathews . |
| 4,484,265 | 11/1984 | Czekalski . |
| 4,516,219 | 5/1985 | Ishida . |
| 4,584,682 | 4/1986 | Shah et al. ............... 371/10.1 |
| 4,740,917 | 4/1988 | Denis et al. ............. 365/174 X |

*Primary Examiner*—Thomas M. Heckler
*Attorney, Agent, or Firm*—Philip P. Macnak; Vincent B. Ingrassia; William E. Koch

[57] ABSTRACT

A reconfigurable deinterleaver for deinterleaving up to N interleaved codewords, each up to M bits in length comprises a memory array, a memory for storing predetermined deinterleaver parameters, a controller, and column and row selector means. The memory array is configured with N bit rows by M bit columns, and is capable of selectably deinterleaving interleaved codewords. The predetermined deinterleaver parameters define the number and length of the interleaved codewords to be deinterleaved. The controller is responsive to the deinterleaver parameters for controlling the writing of interleaved codewords into the memory array and for reading deinterleaved codewords from the memory array. Column and row selector means provide for writing interleaved codewords into, and reading deinterleaved codewords from only a portion of the memory array when smaller data blocks are deinterleaved.

24 Claims, 10 Drawing Sheets

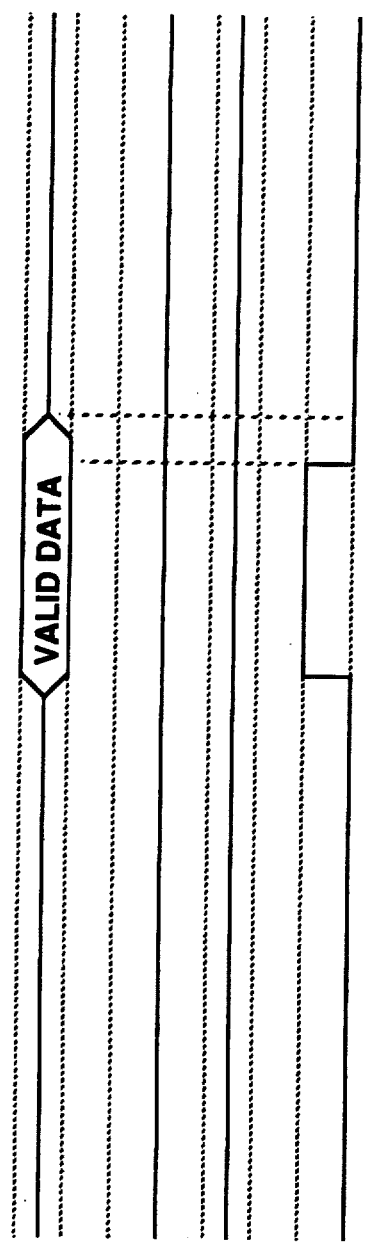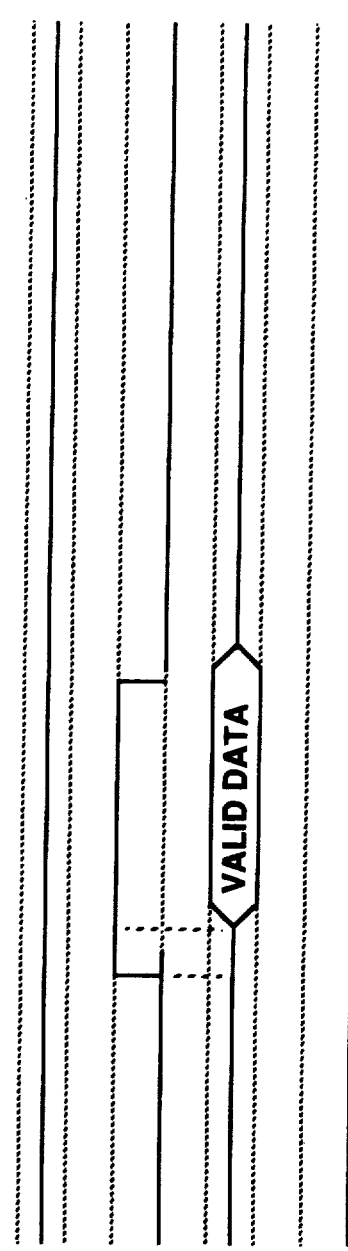

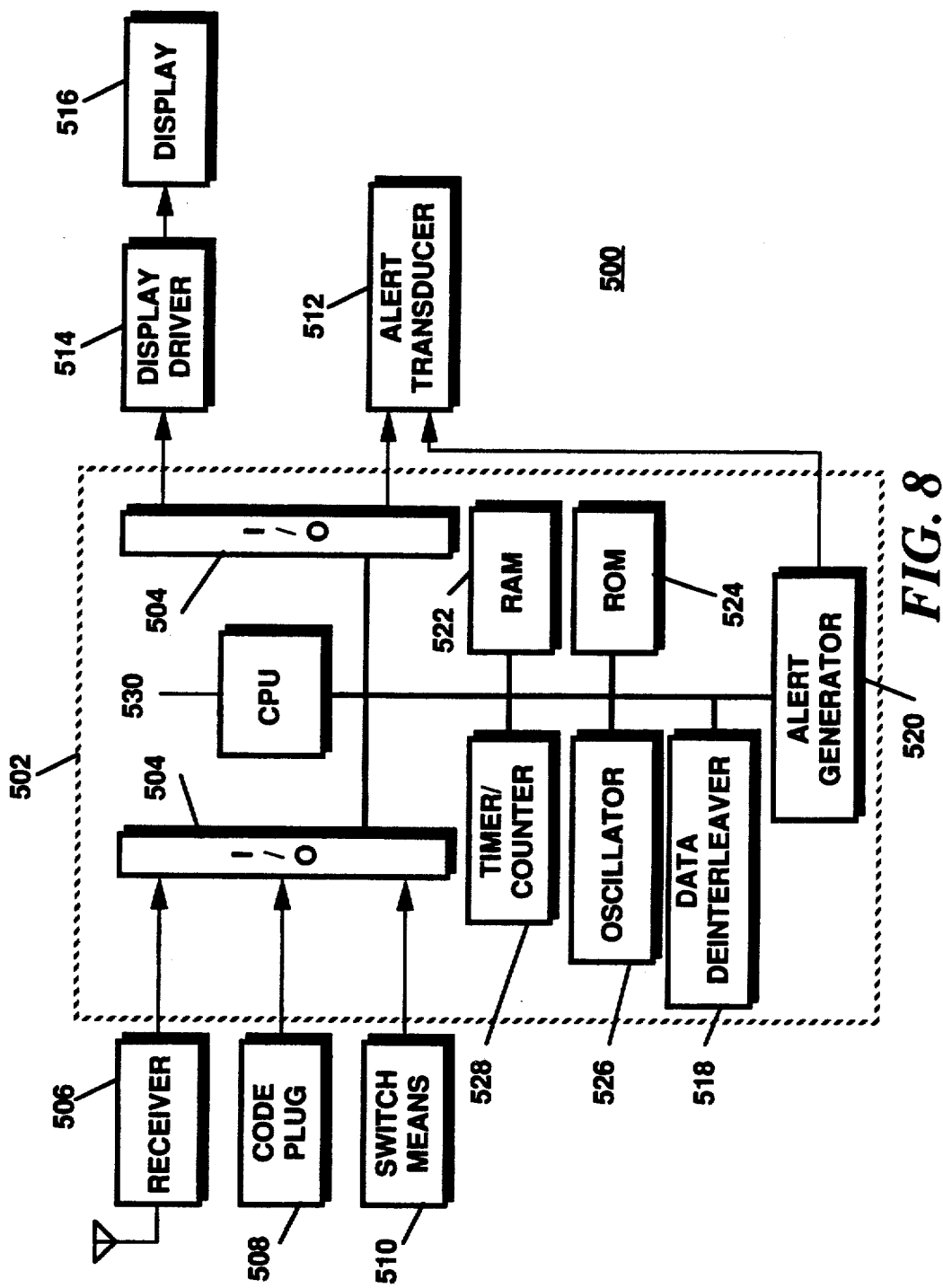

5,063,533

RECONFIGURABLE DEINTERLEAVER/INTERLEAVER FOR BLOCK ORIENTED DATA

BACKGROUND OF THE INVENTION

1. Field of the Invention

The present invention generally relates to the field of data processing devices, and more particularly to a reconfigurable deinterleaving/interleaving device for block oriented data, suitable for use in a portable communication receiver.

2. Description of the Prior Art

Many communication protocols in use today interleave the data prior to transmission to provide immunity from noise and burst errors. One such communication protocol which interleaves message data for transmission is the Golay Sequential Code format, widely used in paging systems manufactured by Motorola, Inc. The interleaved message data, when received by a pager, must be deinterleaved to extract the true information content of the message prior to displaying the data. Such pagers have used a microprocessor and software algorithms to deinterleave the data as the data was received. Substantially more memory was required with the software deinterleaving process, than was required to simply store the received interleaved data, due to the complexity of the deinterleaving process. In order to be able to process long messages, two scratch pad memory areas were required, a first area to store a portion of the message as it was currently being received, and a second area which stored a previously received portion of the message. As the first memory area was being filled, the second memory area was being deinterleaved. By the time the first memory area was filled, deinterleaving of the second memory area was completed, in which case data in the first memory area was then deinterleaved, while new data was being stored in the second memory area. The process of switching between scratch pad memory areas was continued until the complete message was received, deinterleaved and stored in the message memory.

Multiple dedicated scratch pad memory areas were required to deinterleave the data as it was received, as the software deinterleaving algorithm was clock cycle intensive, and deinterleaving of the interleaved data block could not be completed by the microcomputer before the next data block was being received. To software deinterleave one Golay Sequential Code (GSC) data block, which consists of eight codewords, seven 15,7 BCH codewords plus a fifteen bit block parity codeword, required in excess of 3100 clock cycles. Also, to perform the deinterleaving process on one interleaved data block during the time the second interleaved data block was being received required the microcomputer to operate at a substantially high data bus rate of approximately 1 MHz. Operation at such a high bus rate resulted in increased microcomputer current drains, impacting the pager battery life obtainable compared to processing non-interleaved data. The problems of a clock cycle intensive deinterleaving routine and increased current drain are compounded when codewords longer than fifteen bits are interleaved, or when codewords are interleaved to a depth greater than eight codewords. Software deinterleaving rapidly becomes impractical at data rates above the 600 bit per second data rate of the GSC code format, as data would be received faster than it could be deinterleaved. To deinterleave at higher data rates would require the received data be completely stored prior to deinterleaving, greatly increasing the memory required to process and store messages.

Prior art deinterleavers have also previously only been designed to deinterleave a single interleaved data block format. However, pagers have been described which are capable of operating in systems utilizing different signaling, or code formats. One such pager is described in U.S. Pat. No. 4,518,961, issued May 21, 1985 to Davis, et al., entitled "Universal Paging Device with Power Conservation" which is assigned to the assignee of the present invention. The pager described is capable of adaptively decoding a plurality of signaling formats, such as the Golay Sequential Code signaling format and the POCSAG signaling format. While the POCSAG data blocks are not interleaved, increased reliability in data transmission could be obtained if the data blocks were interleaved, due to the elimination of burst errors. However, the GSC data block consists of fifteen bit codewords, while the POCSAG data block consists of thirty-two bit codewords, and consequently, prior art data deinterleavers were incapable of processing both data formats. There is a need for a data deinterleaver which can deinterleave variable length data codewords and which can be simply reconfigured to deinterleave more than one interleaved data block size for use with more than one signaling format.

SUMMARY OF THE INVENTION

An apparatus for deinterleaving data comprising N bit codewords interleaved to depth M (where M and N are positive value integers) includes a plurality of memory cells configured as an array of N bit rows by M bit columns, each memory cell having an input for writing a data bit, and an output for reading the data bit. The apparatus includes a circuit for writing N codewords, M bits long, into the M bit columns of the memory array, and a circuit for reading M deinterleaved codewords, N bits long, from the N bit rows of the memory array.

A reconfigurable deinterleaver for deinterleaving up to N interleaved codewords, each up to M bits in length comprises a memory array, a memory for storing deinterleaver parameters, and a controller. The memory array is configured with N bit rows by M bit columns, and is capable of selectably deinterleaving interleaved codewords. The deinterleaver parameters define the number and length of the interleaved codewords (up to N by M) to be written into the memory array, and the number and length of deinterleaved codewords to be read from the memory array. The controller is responsive to the deinterleaver parameters for controlling the writing of interleaved codewords into the memory array and for reading deinterleaved codewords from the memory array.

It is an object of the present invention to provide an apparatus for deinterleaving data transmitted at a plurality of bit rates.

It is further an object of the present invention to provide an apparatus for deinterleaving data which is reconfigurable to deinterleave variable size interleaved data blocks.

It is a further object of the present invention to provide an apparatus for deinterleaving data which operates with low current drain.

It is a further object of the present invention to provide an apparatus for deinterleaving data which is readily integratable.

It is a further object of the present invention to provide a data deinterleaver which is capable of interleaving non-interleaved data.

These and other objects of the present invention will become apparent to those of skill in the art upon consideration of the following description of the invention and from the accompanying drawings.

BRIEF DESCRIPTION OF THE DRAWINGS

The features of the invention which are believed to be novel are set forth with particularity in the appended claims. The invention itself, together with its further objects and advantages thereof, may be best understood by reference to the following description when taken in conjunction with the accompanying drawings, in the several figures of which like reference numerals identify identical elements, in which and wherein:

FIGS. 3A and 3B are simplified timing diagrams showing the writing and reading operations of the preferred embodiment of the present invention.

FIG. 8 is an electrical block diagram of a communications receiver utilizing the microprocessor controlled data deinterleaver of the preferred embodiment of the present invention.

DESCRIPTION OF THE PREFERRED EMBODIMENTS

Figure 1:
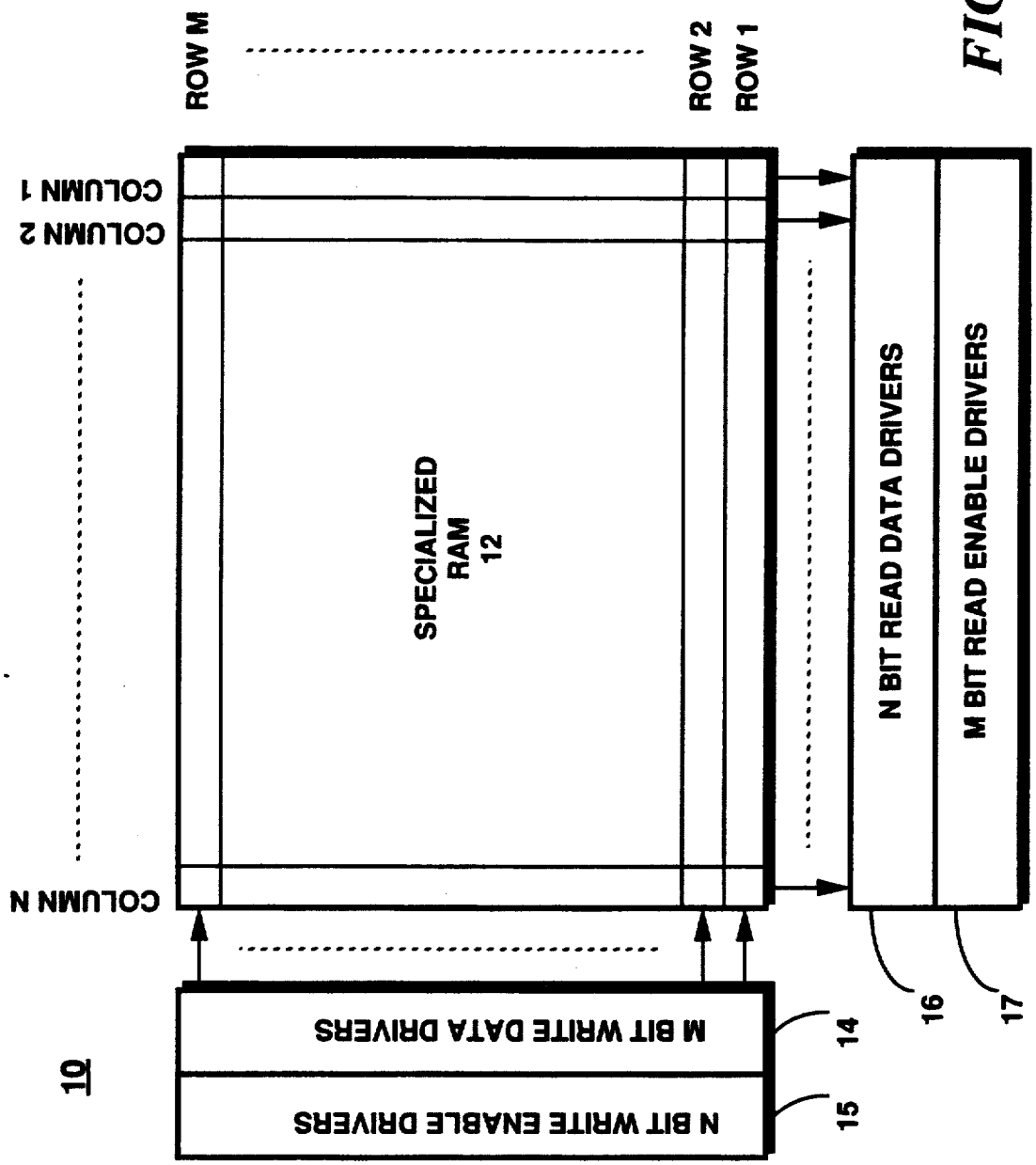
FIG. 1 is a simplified block diagram of the memory array for the preferred embodiment of the present invention.

FIGS. 1 through 8 illustrate the preferred embodiments of the present invention. In particular, FIG. 1 shows a simplified block diagram of the memory array 10, capable of deinterleaving interleaved codewords, and used in the construction of the preferred embodiment of the present invention. With appropriate modifications to be described later, memory array 10 would also be capable of interleaving non-interleaved data. The immediate description to follow will focus on the aspects of deinterleaving interleaved data. Memory array 10 includes a specialized random access memory, or deinterleaving RAM 12 constructed to permit simplified deinterleaving of data. A detailed description of deinterleaving RAM 12 is provided with FIG. 2. The deinterleaving RAM 12 of FIG. 1 is constructed as an array of M rows by N columns of memory cells for data storage. The number of rows, M, of memory cells provided is determined by such requirements as the depth of interleaving, i.e. the total number of codewords being interleaved. The number of columns, N, of memory cells provided is determined by such requirements as the length of the longest deinterleaved codeword. Coupled to each row of memory cells is an M bit write data driver 14 and coupled to each column of memory cells is an N bit write enable driver 15, which allows writing up to M bits of interleaved data into up to N columns of the deinterleaving RAM array 12. Also coupled to each column of memory cells is an N bit read data driver 16 and coupled to each row of memory cells is an M bit read enable driver 17, which allows reading up to N bits of deinterleaved data from up to M rows in deinterleaving RAM 12, in a manner which will become apparent in the description to follow.

Figure 2:
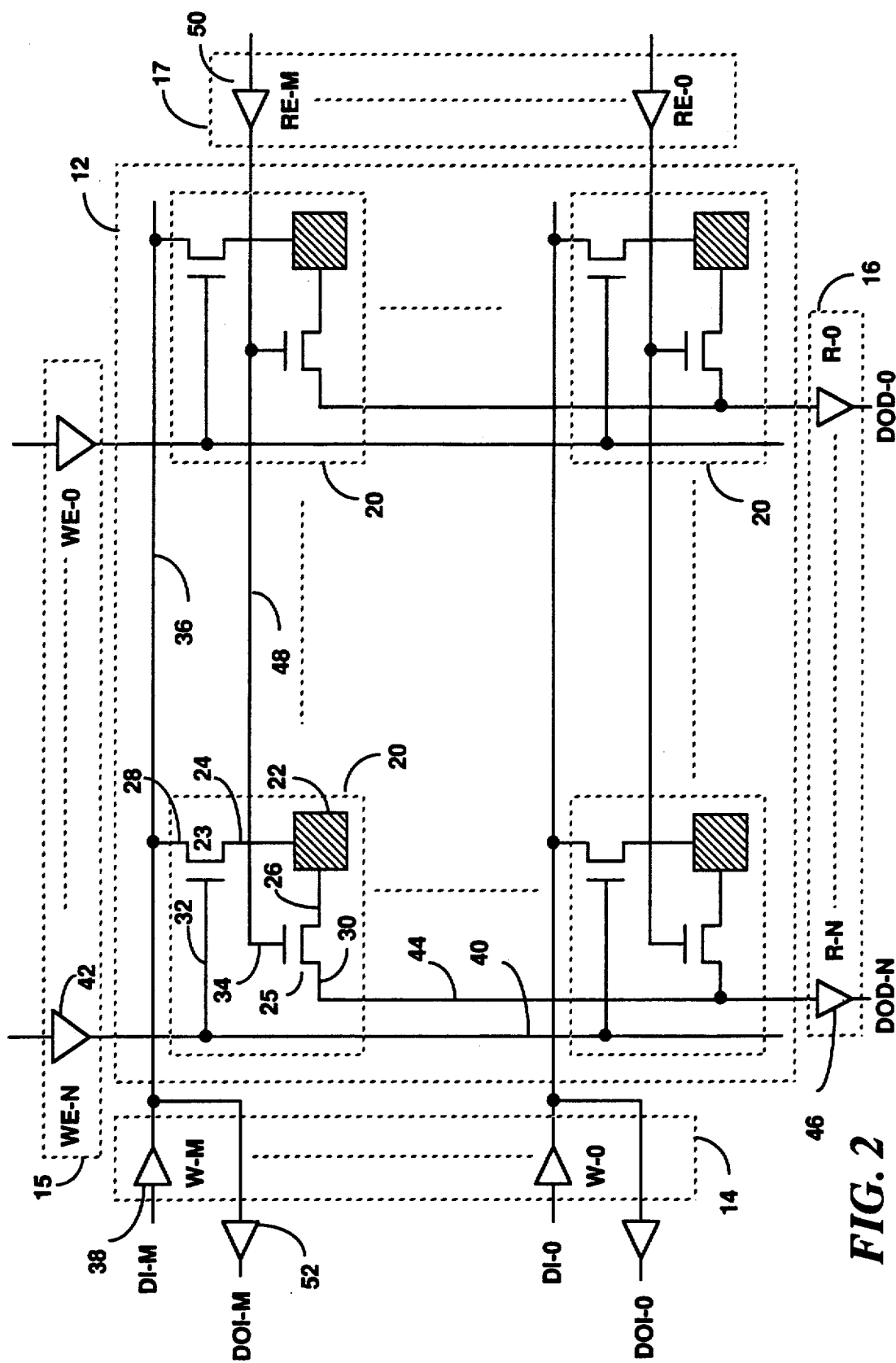
FIG. 2 is an electrical schematic diagram of a portion of a memory array of FIG. 1, suitable for constructing the preferred embodiment of the present invention.

FIG. 2 is an electrical schematic diagram showing a portion of deinterleaving RAM 12. FIG. 2 shows the electrical interconnection of the deinterleaver cells 20 forming deinterleaving RAM 12. The deinterleaver cells 20 include a basic memory cell 22 having an input 24 for writing a data bit, and an output 26 for reading the data bit. Memory cell 22 may be constructed from any number of well known memory cell designs, including both static memory cell and dynamic memory cell designs. It will be appreciated that depending upon the particular memory cell design utilized, the input 24 for writing and the output 26 for reading may be separate connections, as in many well known static and dynamic memory cell designs, or the input and output may be a common connection, as in a number of well known dynamic memory cell designs. The memory array of the preferred embodiment of the present invention is intended to be manufactured as an integrated circuit, using one of the standard integrated circuit processing technologies. Because battery voltage is an issue in a portable communication receiver, such as a pager, integrated circuit technologies, such as the standard CMOS integrated circuit technology which offers operation at a 3.0 volt supply voltage, or a low threshold voltage CMOS technology which offers operation at a 1.5 volt supply voltage is preferred for implementation. It will be appreciated, that there are other integrated circuit technologies that are available that can be utilized as well.

Each deinterleaver cell 20 includes an N-channel MOS transistor 23 which provides a means for writing into the corresponding memory cell 22. An N-channel MOS transistor 25 also provides a means for reading from the corresponding memory cell 22. Each N-channel MOS transistor 23 functions as a write enable device having a write enable input, corresponding to the gate terminal 32 of the device, a write data input, corresponding to the source terminal 28 of the device, and a write data output, corresponding to the drain terminal 24 of the device. It will be appreciated that the source and drain terminals may be interchanged for a MOS transistor without affecting the function of the device described above. It will also be appreciated, depending on the configuration of the memory cell utilized, P-channel MOS transistors may be utilized in the place of the N-channel MOS transistors described as well. The source terminals 28, of each deinterleaver cell 20 in a row are coupled to a write data line 36 which originates from write data driver 38. The gate terminals 32, of each deinterleaver cell 20 in a column are coupled to a write enable line 40 which originates from write enable driver 42. M bit data (DI-O-DI-M) presented at the inputs of the M write data drivers 38 is written into a selected column of the array for each write enable driver 42 enabled.

Each N-channel MOS transistor 25 functions as a read enable device having a read enable input, corresponding to the gate terminal 34 of the device, a read data output, corresponding to the drain terminal 30 of the device, and a read data input, corresponding to the source terminal 26 of the device. The drain terminals 30, of each deinterleaver cell 20 in a column are coupled to a read data line 44 which couples to read data driver 46. The gate terminals 34, of each deinterleaver cell 20 in a row are coupled to a read enable line 48 which originates from read enable driver 50. N bit data (DOD-O-DOD-N) presented at the inputs of the N read data drivers 46 are read from a selected row of the array for each read enable driver 50 enabled.

In addition to writing interleaved data (DI-O-DI-M) into deinterleaver RAM 12 and reading deinterleaved data (DOD-O-DOD-N) from deinterleaver RAM12, interleaved data (DOI-O-DOI-M) may also be read from deinterleaver RAM 12. As shown in FIG. 2, interleaved data may be read from deinterleaver RAM 12 using read drivers 52, the input of which couples to write data lines 36. In the configuration shown, memory cell 22 has a common connection for data input and output. It will be appreciated, the connection shown will be different when the data input and data output to memory cell 22 are distinctly different lines. When the deinterleaver RAM is configured as described, deinterleaver RAM 12 can be used as a conventional RAM and as a deinterleaver RAM. The utility of this flexibility will become more apparent in the description to follow.

FIG. 3A shows simplified timing diagrams for writing data into the columns of memory array 12. Valid data is provided to the deinterleaver cells 20 by the write data drivers 14 (DI-O-DI-M). The row enable drivers 17 outputs are low (row enable), inhibiting the read operation during the write operation. The deinterleaved data, or row data driver 16 outputs (DOD-O-DOD-N), are also disabled, set in the tri-state or high impedance output state. The valid data is clocked into the appropriate column memory cells when a column enable signal is presented at one of the outputs of write enable drivers 15. As shown, valid data must not change while the column enable signal is present, otherwise incorrect data may be loaded into the memory cells.

FIG. 3B shows simplified timing diagrams for reading valid data from the columns of memory array. The write data drivers 14 are disabled (column data), set in the tri-state or high impedance output state. The row enable signal is presented at one of the outputs of row enable drivers 17 to clock out valid data from the appropriate row memory cell. The delay in reading the valid data is shown as the difference when the row enable is provided and valid data is present. The write enable drivers 15 outputs are low (column enable), inhibiting the write operation during the read operation. It will be appreciated by one of ordinary skill in the art, the timing diagrams describing the write and read operations which are for a static memory cell configuration are by way of example only, and will change depending upon the requirements of other types of memory cells which may also be implemented.

Figure 4:
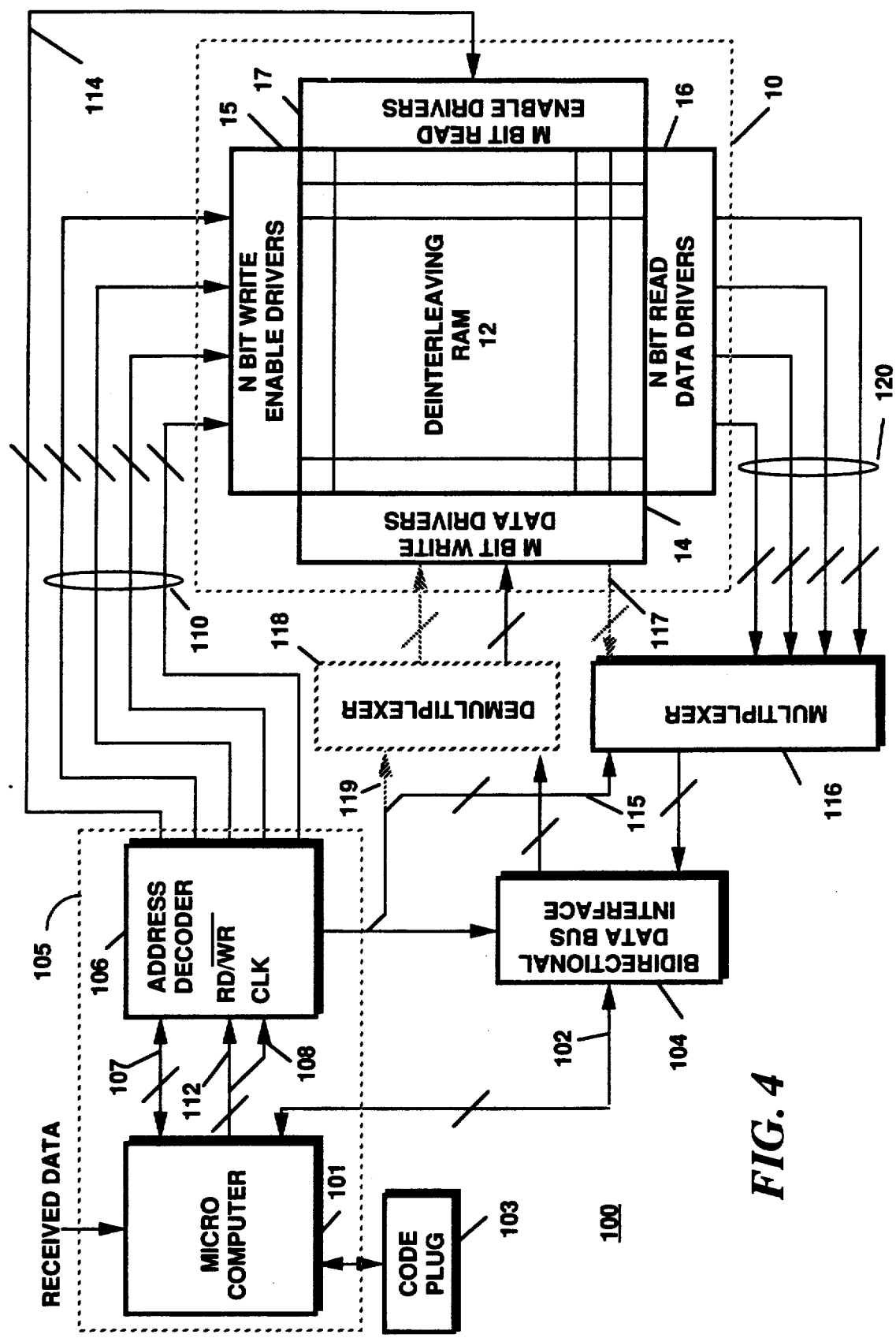
FIG. 4 is an electrical block diagram of a reconfigurable data deinterleaver constructed in accordance with the present invention.

An electrical block diagram of a reconfigurable data deinterleaver 100 constructed in accordance with the present invention is shown in FIG. 4. For purposes of describing the operation of data deinterleaver 100, a memory array having a size of eight bit rows (M=8) by thirty-two bit columns (N=32) will be described. Such a memory array size is capable of being used to deinterleave data blocks, such as having eight, fifteen bit long interleaved GSC codewords, or eight, thirty-two bit long interleaved BCH codewords, as will become apparent shortly. It will be appreciated, the memory array size described is for example only, and other memory array sizes, larger and smaller may also be utilized, depending upon the bit lengths of the deinterleaved codewords, and the number of codewords being interleaved. Also, for purposes of description, the data deinterleaver operation is described in conjunction with a microcomputer 101, such as an MC 68 HC 05 C4 manufactured by Motorola, Inc. which has an eight bit data bus. It will be appreciated that other data bus sizes, such as four and sixteen bit data buses, could be utilized for control and data transfers as well, depending on such requirements as the size of the data block to be deinterleaved and the choice of microprocessor or microcomputer utilized.

In operation, eight thirty-two bit BCH codewords are interleaved for transmission, as is well known in the art, and the information is serially transmitted over any of a number of suitable communication channels, such as a radio frequency channel, as thirty-two eight bit interleaved codewords. In the preferred embodiment of the present invention, a receiver (not shown) receives the information and the received information is processed in a bytewise fashion as thirty-two eight bit interleaved codewords supplied to microcomputer 101 through the I/O bus. The information is provided to data deinterleaver 100 via eight bit data bus 102 which couples the eight bit interleaved codewords to bidirectional data bus interface 104. The output of bidirectional data bus interface 104 couples the eight bit interleaved codewords to the write data drivers 14 under the control of address decoder 106 when the write signal 112 is present. For purposes of the present description, demultiplexer 118 is not required, and the output of bidirectional data bus interface 104 couples directly to write data drivers 14. The function of demultiplexer 118 will be described in detail shortly.

In the preferred embodiment of the present invention shown in FIG. 4, microcomputer 101 generates thirty-two predetermined addresses for writing the interleaved data into deinterleaver RAM 12, and thirty-two predetermined addresses for reading the deinterleaved data from deinterleaver RAM 12. Address decoder 106 receives the predetermined addresses over address bus 107 and decodes the predetermined addresses for writing interleaved data, providing thirty-two write enable outputs 110 to write enable drivers 15. Eight bit interleaved data (L=8), present at the input of write data drivers 14, is loaded into deinterleaving RAM 12 a column at a time until all interleaved data received has been stored in the memory array of deinterleaving RAM 12. The deinterleaved data is then read from deinterleaving RAM 12 under control of address decoder 106 when the read signal 112 is present. Address decoder 106 decodes the assigned addresses for reading deinterleaved data, providing eight read enable outputs 114 to read enable drivers 17. The deinterleaved data is read a row at a time from deinterleaving RAM 12 with read data drivers 16, and is further processed by a row selector means, such as multiplexer 116 to provide four eight bit deinterleaved codewords, or segments 120, in a bytewise fashion, to bidirectional data bus interface 104. Reading of the deinterleaved codewords is controlled by controller means 105 which generates read control signals 115 which controls the sequence of which segment, or byte, of the deinterleaved codeword is read. The deinterleaved codewords are then processed through an error corrector (not shown) and stored into memory (not shown). As described, microcomputer 101 and address decoder 106 function as a controller means 105 for writing interleaved codewords and for reading deinterleaved codewords.

Interleaved data having different block sizes is readily processed by data deinterleaver 100. The example above described how thirty-two eight bit interleaved codewords are deinterleaved into eight thirty-two bit deinterleaved codewords. Interleaved GSC, or 15,7 BCH codeblocks, are processed similarly. However, the address range is simply modified to write only fifteen eight bit interleaved codewords into deinterleaving RAM 12, instead of thirty-two codewords. Also, in reading out the data, only two eight-bit deinterleaved codeword segments are required to read from deinterleaving RAM 12 in the bytewise fashion. A total of fifteen predetermined addresses are required to write the interleaved codewords, and sixteen predetermined addresses are required to read the deinterleaved codewords. A code plug 103 provides a means for storing predetermined deinterleaver parameters, such as those defining the number and length of the interleaved codewords (up to N by M) to be written and the number of deinterleaved codewords (up to M by N) to be read. Code plug 103 provides a programmable memory area, which may be implemented using an EEPROM (electrically erasable programmable read only memory), or similar programmable nonvolatile memory, allowing the data deinterleaver to be readily reconfigured for different data block sizes. When adaptive decoding capability is provided in a pager such as described in U.S. Pat. No. 4,518,961 to Davis et al, code plug 103 would store the deinterleaver parameters to be recalled as the decoder adaptively changed to the different decoding formats.

While the examples above described deinterleaving data blocks thirty-two by eight and fifteen by eight in size, it will be appreciated a larger number of codewords can be deinterleaved by adding a column selector means, such as a demultiplexer 118 to data deinterleaver 100, as shown in dotted lines in FIG. 4. Data would then be written in eight bit segments in a bytewise fashion into deinterleaving RAM 12 under the control of controller means 105 which generates data inputs signals 119 which controls the sequence of which segment, or byte, of the interleaved codeword is written. The data block size which can be deinterleaved is limited only by the size of deinterleaving RAM 12, and as described, is independent of the signaling format or the data block size, unlike most prior art deinterleavers which have generally been limited to deinterleaving a single interleaved data block size. Depending upon the size of the memory array, interleaved codewords may be written into only a portion of the N bit rows and M bit columns, such as when a GSC data block of eight fifteen bit codewords is written into a memory array of sixteen rows by thirty-two columns.

In addition to reading deinterleaved data, data deinterleaver 100 may also be configured as a conventional RAM. In this instance, interleaved data is read from the deinterleaver RAM 12 via an eight bit, or more, data bus 117 which couples the data through multiplexer 116 and bidirectional data bus interface 104. Thus, data deinterleaver 100 may thus be used as a scratch pad memory when data deinterleaving is not required, and as a data deinterleaver when data deinterleaving is required.

Figure 5:
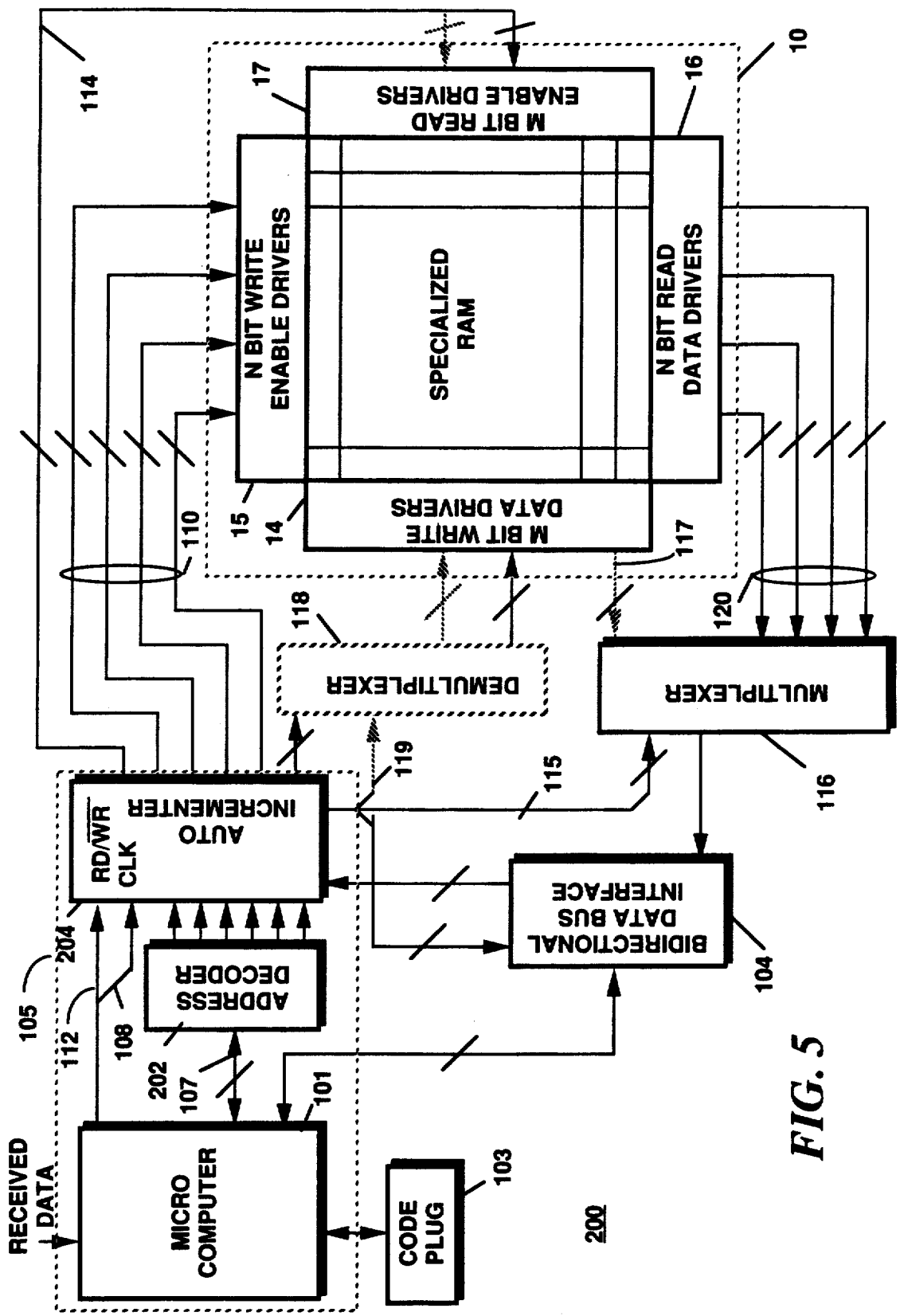
FIG. 5 is an electrical block diagram of an alternate embodiment of a reconfigurable data deinterleaver constructed in accordance with the present invention.

FIG. 5 shows an alternate construction for data deinterleaver 100 shown in FIG. 4. The operation of data deinterleaver 200 of FIG. 5 is similar to that described previously. However, unlike data deinterleaver 100, which required the microcomputer to generate the range of addresses for writing the interleaved codewords, and the range of addresses for reading the deinterleaved codewords, only a limited number of addresses are required to control the operation of data deinterleaver 200. The operation of data deinterleaver 200 is identical to data deinterleaver 100, except controller means 105 includes microcomputer 101, address decoder 202 and an auto incrementer circuit 204, the operation of which is described in detail with FIGS. 6 and 7.

Figure 6:
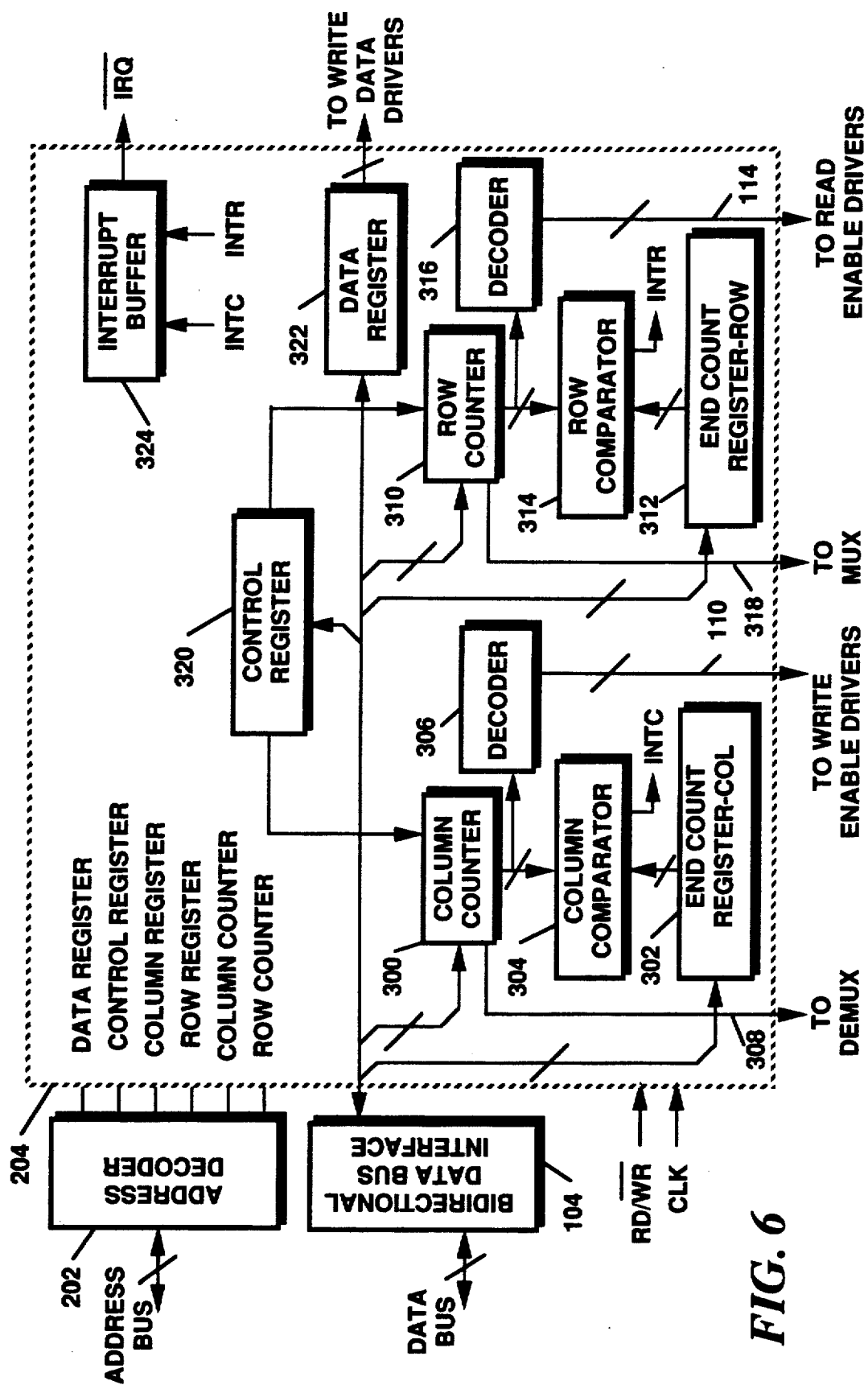
FIG. 6 is an electrical block diagram of an auto incrementer suitable for use with the reconfigurable data deinterleaver of the present invention.

An auto incrementer means, such as auto incrementer 204 shown in FIG. 6 requires only a limited address range to control the operation of data deinterleaver 200, as compared to data deinterleaver 100 of FIG. 5. Auto incrementer 204 includes a programmable column counter means, such as column counter 300, a column end count register means, such as column end count register 302 and a comparator means, such as column comparator 304 which are used to control the writing of the interleaved data into deinterleaving RAM 12. Column counter 300 may be implemented using a binary counter, such as a five bit binary counter for a thirty-two column by eight row memory array, or a six bit binary counter for a thirty-two by sixteen row memory array. A five bit counter provides the required count of thirty-two, while a six bit counter provides the required count of sixty-four, as further described in FIG. 7. In operation, column counter 300 may be initially reset, with the column end count register 302 set to the number of interleaved codeword segments to be written. Column counter 300 may also be preset to a nonzero value, such as thirty-two, and the column end count register 302 set to sixty-four so as to allow deinterleaving a codeword in the higher order bits of memory array 12. Column count signals outputted from column counter 300 couples to column comparator 304 which generates an output INTC when the correct number of interleaved codewords have been written into deinterleaver RAM 12. The output of column counter 300 also couples to a column decoder means, such as decoder 306 which generates the write enable signals 110 for writing the received interleaved codewords. Data input signals to control demultiplexer 118 operation are also generated by column counter 300, from the least significant bit, thereby controlling the writing of up to two eight bit codeword segments per column.

Auto incrementer 204 also includes a programmable row counter means, such as row counter 310, a row end count register means, such as row end count register 312 and comparator means, such as row comparator 314 which are used to control the reading of deinterleaved data from deinterleaving RAM 12. Row counter 310 may be implemented using a binary counter, such as a six bit binary counter for a thirty-two column by sixteen row memory array. A previously described, a five or six bit counter would provide the required count to read from the thirty-two by eight or thirty-two by sixteen memory array in eight bit segments. In operation, row counter 310 may be initially reset, with the row end count register 312 set to the number of codeword segments to be read. The row counter 310 may also be preset to a non-zero value, such as thirty-two, and the row end count register 312 set to sixty-four so as to allow deinterleaving in the higher order rows of memory array 12. The output of row counter 310 couples to row comparator 314 which generates an output INTR when the correct number of interleaved codewords has been read from deinterleaver RAM 12. Row count signals outputted from row counter 310 also couples to a row decoder means, such as decoder 316 which generates the read enable signals 114 for reading the deinterleaved codewords. Data output signals to control multiplexer 116 operation are also generated by row counter 310, from the two least significant bits, to control the reading of up to four eight bit deinterleaved codeword segments.

Operation of the column counter 300 and row counter 310 is controlled by control register 320. Control register 320 controls the selection of column or row counter operation and the resetting or presetting of the column and row counters. Interleaved data to be written into deinterleaver RAM 12 is first written into data register 322 prior to writing into the deinterleaver RAM, as previously described. The signals INTC indicating the completion of the writing of interleaved data into deinterleaver RAM 12, and INTR indicating the completion of reading deinterleaved codewords from deinterleaver RAM 12 are loaded into interrupt buffer 324 for processing by microcomputer 101.

Figure 7A:
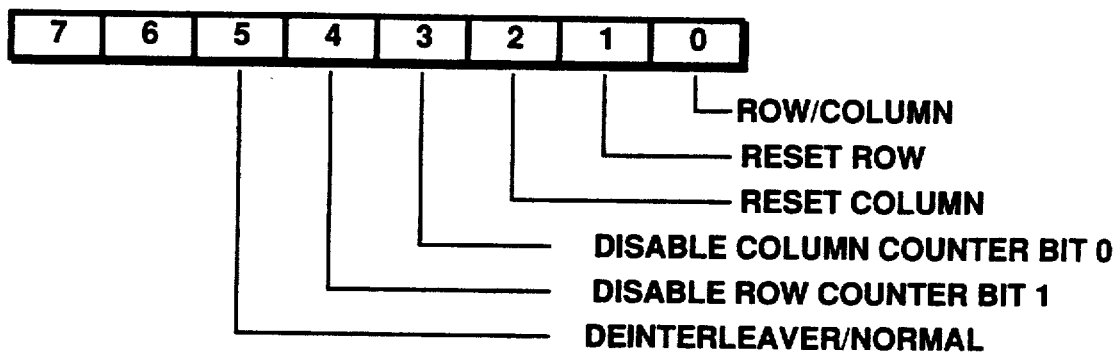
FIG. 7A shows the microcomputer control words for controlling the auto incrementer of FIG. 6, and FIG. 7B, address map of the deinterleaver RAM.
Figure 7B:
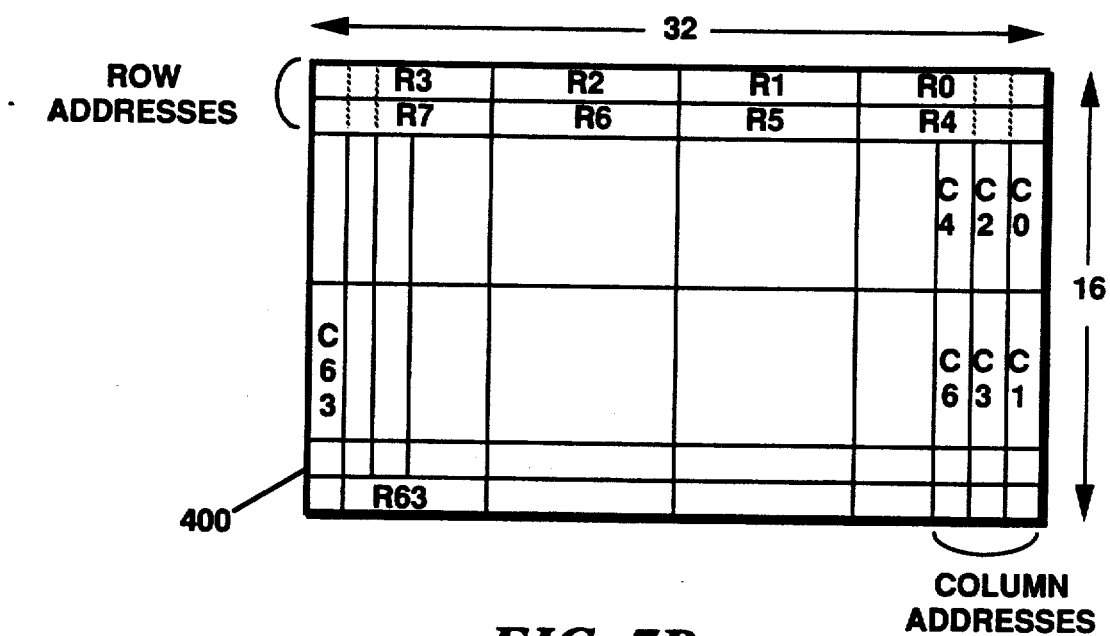

FIG. 7 shows the address assignments for the deinterleaver RAM 12 for writing interleaved codewords, and for reading deinterleaved codewords. The address assignments are for a sixteen bit row by thirty-two bit column array, and assumes reading and writing of the codewords in eight bit segments for use with a microcomputer having an eight bit data bus. As shown, a total of sixty-four addresses are required to write interleaved codewords into the columns (C0–C63), each column requiring two addresses, and represent a first address group generated by the microcomputer. A total of sixty-four addresses are also required to read deinterleaved codewords from the rows (R0–R63), each row requiring four addresses, and represents a second address group generated by the microcomputer. The number of addresses required is by way of example only, and it will be appreciated, the number of addresses required is a function of the memory array size and the data bus size. Four codewords, the column counter codeword, the row counter codeword, the column end count codeword, and the row end count codeword are read from the code plug and are loaded into the column counter, row counter, column end count register and row end count register, respectively to control the writing and reading of the deinterleaver RAM 12 and also to provide the reconfigurability for deinterleaver RAM 12.

Control for writing and reading of deinterleaver RAM 12 is provided by control register 320. The control register codeword 402 is also shown in FIG. 7 and provides control of such auto incrementer functions as row/column selection, resetting and presetting of the row and column counters and altering the column and row counter operations to write into and read from the complete deinterleaver RAM, or a portion of the deinterleaver RAM, as would be required with interleaved data blocks having fewer codewords, or shorter codewords lengths. The operation of data deinterleaver 200 as a data deinterleaver or a scratch pad memory is also controlled by codeword 402.

As shown by the address map of FIG. 7, when the data deinterleaver is reconfigured to deinterleave a small data block, the operation of the row and column counters would be required to change, the changes being controlled by two bits in the control register codeword 402. In operation, when the complete memory array is used to deinterleave, data is consecutively written into addresses C0, C1, C2, etc. However, if only an eight codeword data block is being deinterleaved, data is written into addresses C0, C2, C4, etc. The column counter operation is altered, such that the bit 0 flip-flop would be set to a logic zero out while the bit 1 flip-flop is clocked under control of the control register codeword 402. Likewise, when the higher order codewords are used for deinterleaving, data would be written into addresses C1, C3, C5, etc. In this case, the column counter bit 0 flip-flop is set to a logic one while the bit 1 flip-flop is clocked.

In normal operation, when the complete memory array is used to deinterleave data, data is consecutively read from addresses, R0, R1, R2, R3, etc. However, when codewords shorter than thirty-two bits are read from the data deinterleaver, such as for sixteen bit codewords, data would be read from addresses R0, R1, R4, R5, etc. The row counter operation is altered, such that the bit 1 flip-flop is set to a logic zero, and the bit 0 flip-flop output is used to clock the bit 2 flip-flop. When the higher order codewords are used for deinterleaving, data might be read from addresses R2, R3, R6, R7, etc. In this case, the row counter bit 1 flip-flop is set to a logic one, and the bit 0 flip-flop output is again used to clock the bit 2 flip-flop. The register codeword thereby provides the additional control required to deinterleave data blocks having either smaller codeword lengths or a smaller number of codewords.

The data deinterleaver previously described may be utilized in a communication receiver 500, such as a pager, as shown in FIG. 8. The communication receiver 500 of FIG. 8 includes a microcomputer 502 for controlling the operation of the pager in a manner well known to one of ordinary skill in the art. Microcomputer 502 includes I/O ports 504 for interfacing with the external pager circuits, such as the receiver section 506, code plug 508, switch means 510, alert transducer 512, display driver 514 and display 516. Receiver section 506 is used to receive the coded message signals including address information and interleaved data. The output of receiver section 506 is a stream of binary information corresponding to the received address and the interleaved data which couples to I/O 504. Code plug 508 stores predetermined address information, and other information used in controlling pager operation, including information used to reconfigure the data deinterleaver 518 as previously described. The microcomputer functions as a decoder in a manner well known to one of skill in the art, generating an alert tone signal with alert generator 520 which is delivered by alert transducer 512, when the pager receives an address corresponding to a predetermined address programmed in code plug 508. The interleaved data is processed by data deinterleaver 518 in a manner previously described and stored in memory, such as RAM 522. Depending upon the size of the data messages being received, additional RAM (not shown) may be required for message storage. The alert signal may be reset, and the stored message may be recalled from memory and displayed with switch means 510. When a message is recalled from memory for display, the message information is delivered through I/O port 504 to display driver 514 for presentation on display 516, such as an LCD display suitable for displaying numeric or alphanumeric messages. ROM 524 contains the routines for controlling pager operation, such as for decoding, deinterleaving the received data, error correcting the deinterleaved data, storing the error corrected data and displaying the stored data. Oscillator 526 provides the reference clock for the operation of the microcomputer. Timer/counter 528 is used to generate timing signals required in the operation of the pager, such as for battery saving, controlling the alert tone output, and message display times. Data deinterleaver 518 is reconfigured by programming code plug 508, to deinterleave interleaved data blocks transmitted in any of a number of signaling formats.

Figure 9A:
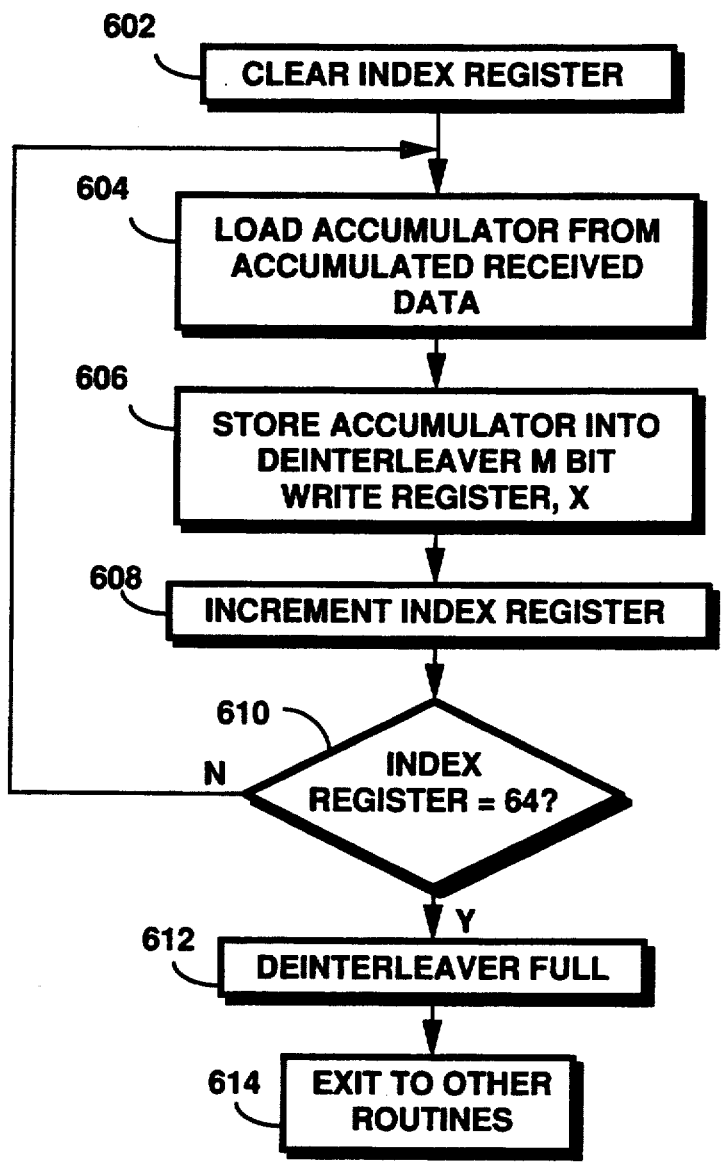
FIGS. 9A and 9B are flowcharts describing the operation of the microprocessor controlled data deinterleaver for the preferred embodiment of the present invention.
Figure 9B:
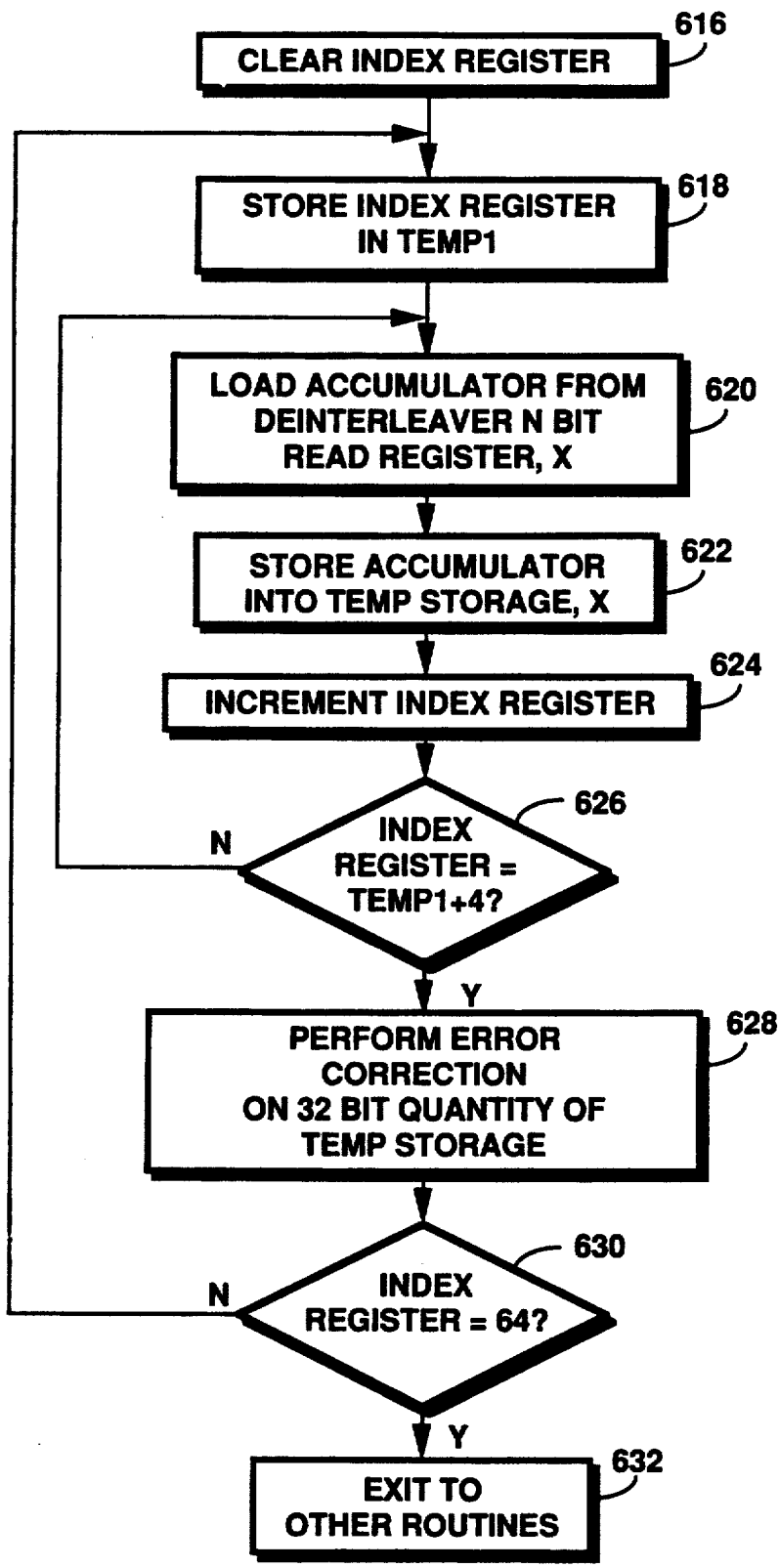

FIGS. 9A and 9B are flowcharts describing the operation of the microprocessor controlled data deinterleaver. For illustration purposes, the size of the data deinterleaver RAM is assumed to be sixteen bit rows by thirty-two bit columns. Consequently, when the data is transmitted, thirty-two sixteen bit interleaved codewords are being transmitted which will result in recovering sixteen thirty-two bit deinterleaved codewords. FIG. 9A describes the operation of loading the data deinterleaving 600. When an address is detected which corresponds to one of the addresses stored in the communication receiver's code plug, the microcomputer begins the data deinterleaving operation. The index register is first cleared, at step 602. The received data stream is loaded into the accumulator as it is received, at step 604. For the 146805C4 microcomputer previously described, eight data bits will be accumulated in the accumulator, after which the contents of the accumulator is written into the deinterleaver RAM, at step 606. Since the size of the deinterleaver RAM columns is sixteen bits, only one-half a column is loaded for each write operation executed. The index register is then incremented, at step 608, and the current value checked to see if a count of sixty-four has been reached, at step 610. If a count of sixty-four has not been reached, steps 604 through 608 are repeated. When a count of sixty-four is reached, the deinterleaver RAM is fully loaded, at step 612. The microcomputer then exits the routine to load the deinterleaver RAM and perform any other routines, at step 614, which may include reading the deinterleaved data which is described in the flowchart of FIG. 9B.

Referring to FIG. 9B, the operation of reading deinterleaved codewords is shown. The index register is first cleared, at step 616, and the contents is stored as RAM variable temp1, at step 618. An eight-bit portion of a deinterleaved codeword is read from a row of the deinterleaver RAM, at step 620, into the accumulator, and then stored in RAM variable temp storage, at step 622. The index register is then incremented, at step 624, and compared to RAM variable temp1+4, at step 626. If the index register has not incremented by temp1+4, steps 620 thru 624 are repeated, to read the balance of the deinterleaved codeword. Once the index register has incremented by temp1+4, a complete deinterleaved codeword has been read and stored in TEMP STORAGE. The microcomputer can perform error correction on the thirty-two bit deinterleaved codeword, at step 628. The index register contents is then compared to sixty-four, at step 630. If a value of sixty-four has not been reached, indicating all deinterleaved codewords have not been read, steps 618 through 628 are repeated. When the index register has reached a value of sixty-four, at step 630, all deinterleaved codewords have been read from the data deinterleaver, and the microcomputer exits the read routine, at step 632. For the example described above, sixteen thirty-two bit deinterleaved codewords are capable of delivering forty-five alphanumeric characters using a 31,21 BCH code with a single block parity bit. For longer data messages, the microcomputer would process them as described above, continuing to write any additionally received interleaved codewords into the data deinterleaver.

The flowcharts of FIGS. 9A and 9B described the operation of the data deinterleaver shown in FIG. 4. Modification of these flowcharts to describe the operation of the data deinterleaver of FIG. 5 which has auto incrementing capability would be apparent to one of skill in the art. As such, flowcharts describing the operation of the data deinterleaver of FIG. 5 are not described herein.

The microcomputer controlled data deinterleaver, as shown in FIG. 4, requires only 255 clock cycles to deinterleave an interleaved GSC data block, compared to 3120 clock cycles required by software deinterleaving with a microcomputer alone. The clock cycle reduction becomes more dramatic for larger data blocks. For the sixteen bit by thirty-two bit data block, only 1088 clock cycles are required for the microcomputer controlled data deinterleaver, compared to 13,312 clock cycles for software deinterleaving with the microcomputer. With the clock cycle reductions achievable, the bus rate required for a microcomputer controlled data deinterleaver can be significantly reduced compared to that required by a microcomputer software deinterleaving the data. As previously described, a microprocessor, software deinterleaving GSC data blocks, was required to run at a one megahertz bus rate. The same microcomputer is able to run at a two hundred kilohertz bus rate with the microcomputer controlled data deinterleaver. Because of the construction of the data deinterleaver, higher speed data, or data containing longer codewords or interleaved to greater codeword depths may now be deinterleaved than previously possible. Because of the reduced bus rates, the microcomputer current drain is also significantly reduced, by as much as eighty Percent and more, which results in increased battery life for the pager. Other interleaved data block sizes may be deinterleaved using a minimum current consumption compared to prior art deinterleavers. Mixed data blocks sizes can be selectably deinterleaved under control of information stored in the code plug, the block sizes limited only by the M bit by N bit deinterleaver memory array size. The data deinterleaver may be integrated as part of the microcomputer chip, as illustrated in the block diagram of FIG. 8, thereby reducing the parts count required for implementation.

While the description provided has described a specialized memory arrangement and apparatus suitable for deinterleaving variable block size data, it will be appreciated by one of ordinary skill in the art, that the specialized memory arrangement and apparatus can also be used to interleave variable block size data as well. As previously described in FIGS. 1 and 2, interleaved data was written into the memory array columns, and deinterleaved data was read from the memory array rows. Since writing and reading of the array are readily reconfigurable, non-interleaved data can also be written into columns, and interleaved data can be read from the rows. In this instance, the column length would have to be equal to the longest non-interleaved codeword to be interleaved, and the row size would be set to the depth of codeword deinterleaving. This data could then be serialized for transmission over a communications link, such as an RF channel. Thus, the deinterleaving RAM structure previously described can also be utilized in the circuits of FIGS. 4 and 5 to provide data interleavers operating in a manner similar to the data deinterleaver previously described.

Furthermore, while the description provided indicates that interleaved data is written into columns of the specialized memory array, and deinterleaved data is read from rows of the specialized memory array, it will be appreciated, the specialized memory array could also have been configured to write interleaved data into the rows of the specialized memory array, and read deinterleaved data from the columns of the specialized memory array.

While specific embodiments of this invention have been shown and described, further modification and improvements will occur to those skilled in the art. All modifications which retain the basic underlying principles disclosed and claimed herein are within the spirit and scope of the present invention.

We claim:

1. A random access memory comprising:
   a plurality of memory cells configured as an array of N bit rows by M bit columns (where M and N are positive integers), each memory cell having an input for writing a data bit, and an output for reading the data bit;
   a plurality of write enable devices, each having a write enable input, a write data input, and a write data output, said write data output of each device being coupled to an individual one of said memory cell inputs;
   M data input lines, each of said data input lines being coupled to a row of write data inputs;
   N write enable input lines, each of said write enable input lines being coupled to a column of write enable inputs;
   a plurality of read enable devices, each having a read enable input, a read data input, and a read data output, said read data input of each device being coupled to an individual one of said memory cell outputs;
   N data output lines, each of said data output lines being coupled to a column of read data outputs; and
   M read enable input lines, each of said read enable input lines being coupled to a row of read enable inputs.

2. The random access memory according to claim 1 wherein the integer N is greater than the integer M.

3. The random access memory according to claim 1 wherein the integer M is greater than the integer N.

4. The random access memory according to claim 1 wherein the integer N is equal to the integer M.

5. The random access memory according to claim 1 wherein each of said write enable devices is an N channel MOS transistor.

6. The random access memory according to claim 1 wherein each of said read enable devices is an N channel MOS transistor.

7. The random access memory according to claim 1 wherein after up to N M-bit data words which have been interleaved to degree N are written into said N columns of said memory array, up to M N-bit data words can be read from said M rows of said memory array, the data words being read being deinterleaved to degree M relative the the data words which were written.

8. The random access memory according to claim 1 wherein after up to M N-bit data words are written into said M rows of said memory array, up to N M-bit data words can be read from said N columns of said memory array, the data words being read being interleaved to degree N relative to the data words which were written.

9. The random access memory according to claim 1 further comprising M data output lines, each of said data output lines being coupled to a row of write data inputs, whereby up to an M bit codeword is written into one of said N columns of said memory cells for each write enable input line selected, and whereby up to an M bit codeword is read from one of said N columns of said memory cells for each write enable line selected.

10. A reconfigurable deinterleaver for deinterleaving interleaved data words, comprising:
    a memory array, having N columns by M rows, the columns being configured to enable writing up to N M-bit interleaved data words therein, the rows being configured to enable reading up to M N-bit data words therefrom, the N-bit data words being deinterleaved relative to the M-bit interleaved data words when the data words are read;
    programmable memory means for storing predetermined deinterleaver parameters defining the number and length of interleaved data words to be written, and number and length of deinterleaved data words to be read; and
    controller means, coupled to said memory array, and responsive to the predetermined deinterleaver parameters, for generating write enable signals for controlling the writing of up to N M-bit interleaved data words into said memory array, and for generating read enable signals for controlling the reading of up to M N-bit deinterleaved data words from said memory array.

11. The reconfigurable deinterleaver according to claim 10, wherein said interleaved data words are written in parallel and said deinterleaved data words are read in parallel.

12. The reconfigurable deinterleaver according to claim 10, wherein said controller means generates data output signals for controlling the reading of interleaved data words from said memory array, and said deinterleaver further comprises row selector means, responsive to the data output signals, for enabling the reading of the deinterleaved data words by selecting L bit segments from each N bit row in a sequence.

13. The reconfigurable deinterleaver according to claim 12, wherein said row selector means comprises data multiplexer means, coupled to said memory array, for enabling the reading of up to N bit deinterleaved data words by selecting one or more L bit segments in a sequence.

14. The reconfigurable deinterleaver according to claim 13, wherein each L bit segment is an eight bit data byte.

15. The reconfigurable deinterleaver according to claim 10, wherein said controller means further generates data input signals for controlling the writing of interleaved data words into said memory array, and said deinterleaver further comprises column selector means, responsive to the data input signals, for enabling the writing of the interleaved data words by selecting L bit segments into each M bit column in a sequence.

16. The reconfigurable deinterleaver according to claim 15, wherein said column selector means comprises data demultiplexer means, coupled to said memory array, for enabling the writing of up to M bit interleaved data words by selecting one or more L bit segments in a sequence.

17. The reconfigurable deinterleaver according to claim 16, wherein each L bit segment is an eight bit data byte.

18. The reconfigurable deinterleaver according to claim 10, wherein said controller means comprises:
   microcomputer means, responsive to the predetermined deinterleaver parameters for generating a first address range corresponding to the number of columns of said memory array into which interleaved data words is to be written, and a second address range corresponding to the number of rows of said memory array from which deinterleaved data words is to be read; and
   address decoder means, responsive to the first address range for generating write enable signals and further responsive to the second address range for generating read enable signals.

19. The reconfigurable deinterleaver according to claim 10, wherein said controller means comprises:
   microcomputer means, responsive to the predetermined deinterleaver parameters for generating at least one predetermined address for effecting the writing of interleaved data words into said memory array, and for effecting the reading of deinterleaved data words from said memory array;
   address decoder means, responsive to the at least one predetermined address for generating a deinterleaver enable signal to initiate writing of interleaved data words into said memory array, and further to initiate reading of deinterleaved data words from said memory array;
   auto incrementing means, responsive to the deinterleaver enable signal, for generating the write enable signals for controlling the writing of interleaved data words into said memory array, and for generating the read enable signals for controlling the reading of deinterleaved data words from said memory array.

20. The reconfigurable deinterleaver according to claim 19, wherein said auto incrementer means comprises:
   programmable column counter means, for generating column count signals;
   column decoder means, responsive to the column count signals, for generating the write enable signals for controlling the writing of interleaved codewords into said memory array;
   column end count register means, for storing the number of columns of interleaved codewords to be written, up to N, and for generating a column end count signal in response thereto;
   column count comparator means, response to the column count and column end count signals for generating a write complete signal in response thereto;
   programmable row counter means, for generating row count signals;
   row decoder means, responsive to the row count signals, for generating the read enable signals for controlling the reading of interleaved data words from said memory array;
   row end count register means, for storing the number of deinterleaved data words to be read, up to M, and for generating a row end count signal in response thereto; and
   row count comparator means, responsive to the row count and row end count signals for generating a read complete signal in response thereto.

21. The reconfigurable deinterleaver according to claim 20, wherein said programmable column and row counter means are resettable to zero.

22. The reconfigurable deinterleaver according to claim 21, wherein said programmable column counter means is presettable to a non-zero value less than N and said programmable column and row counter means is presettable to a nonzero value less than M.

23. The reconfigurable deinterleaver according to claim 10 wherein said deinterleaver further comprises column read data drivers, and wherein said row selector means is further coupled to said column read data drivers and responsive to the data input signals, for enabling the reading of the interleaved codewords by selecting at least a portion of each M bit column.

24. A reconfigurable interleaver for interleaving data words, comprising:
   a memory array, having N columns by M rows, the columns being configured to enable writing up to N M-bit data words therein, the rows being configured to enable reading up to M N-bit data words therefrom, the M N-bit data words being interleaved relative to the data words written when the data words are read;
   programmable memory means for storing predetermined interleaver parameters defining the number and length of non-interleaved codewords (up to N by M) to be written, and number and length of interleaved data words (up to M by N) to be read; and
   controller means, coupled to said memory array, and responsive to the predetermined interleaver parameters, for generating write enable signals for controlling the writing of up to N M-bit data words into said memory array, and for generating read enable signals for controlling the reading of up to M N-bit interleaved data words from said memory array.

* * * * *

UNITED STATES PATENT AND TRADEMARK OFFICE
CERTIFICATE OF CORRECTION

PATENT NO. : 5,063,533

DATED : November 5, 1991

INVENTOR(S) : Erhart et al.

It is certified that error appears in the above-identified patent and that said Letters Patent is hereby corrected as shown below:

Column 14, line 35, after "words", insert --(up to N by M)--.

Column 14, line 37, after "words", insert --(up to M by N)--.

Column 14, line 61, delete "enabling" and insert --effecting--.

Column 14, line 62, delete "data" and insert --code--.

Column 14, line 62, delete "by selecting" and insert --in--.

Column 14, lines 62 and 63, delete "in a sequence".

Column 16, line 5, delete "response" and insert --responsive--.

Signed and Sealed this

Nineteenth Day of January, 1993

Attest:

DOUGLAS B. COMER

Attesting Officer

Acting Commissioner of Patents and Trademarks